(12) United States Patent
Bai et al.

(10) Patent No.: US 11,769,708 B2
(45) Date of Patent: Sep. 26, 2023

(54) PACKAGING-LEVEL CHIP AND CHIP MODULE PACKAGED WITH MAGNETIC COVER, AND ELECTRONIC PRODUCT

(71) Applicant: INNOGRIT TECHNOLOGIES CO., LTD., Shanghai (CN)

(72) Inventors: Yanwen Bai, Shanghai (CN); Shiann-Ming Liou, Shanghai (CN)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 190 days.

(21) Appl. No.: 17/330,651

(22) Filed: May 26, 2021

(65) Prior Publication Data

US 2022/0270951 A1 Aug. 25, 2022

(30) Foreign Application Priority Data

Feb. 20, 2021 (CN) .......................... 202110193674.8

(51) Int. Cl.
*H01L 23/40* (2006.01)
*H01L 23/31* (2006.01)

(52) U.S. Cl.
CPC .......... *H01L 23/40* (2013.01); *H01L 23/3128* (2013.01)

(58) Field of Classification Search
CPC ........................... H01L 23/40; H01L 23/3128
See application file for complete search history.

(56) References Cited

U.S. PATENT DOCUMENTS

| | | | |
|---|---|---|---|
| 2001/0014012 A1 | 8/2001 | Imazato | |
| 2010/0091462 A1 | 4/2010 | Imazato et al. | |
| 2011/0304015 A1* | 12/2011 | Kim | H01L 25/0657 257/532 |
| 2012/0086110 A1 | 4/2012 | Masuda | |
| 2015/0351292 A1* | 12/2015 | Chang | H01Q 7/00 343/866 |
| 2017/0084596 A1* | 3/2017 | Scanlan | H01L 21/561 |
| 2018/0033738 A1* | 2/2018 | Kawabata | H01L 23/49838 |
| 2018/0158782 A1* | 6/2018 | Kawabata | H01L 24/97 |
| 2019/0115281 A1* | 4/2019 | Lee | H01L 23/427 |
| 2019/0259711 A1 | 8/2019 | Hamaguchi et al. | |

FOREIGN PATENT DOCUMENTS

| | | |
|---|---|---|
| CN | 101483157 A | 7/2009 |
| CN | 101653056 A | 2/2010 |
| CN | 108886881 A | 11/2018 |
| DE | 112017005682 T5 | 8/2019 |
| JP | 2001185893 A | 7/2001 |
| WO | 2008099856 A1 | 8/2008 |
| WO | 2010146863 A1 | 12/2010 |
| WO | 2018088318 A1 | 5/2018 |

* cited by examiner

*Primary Examiner* — Peniel M Gumedzoe
(74) *Attorney, Agent, or Firm* — WOMBLE BOND DICKINSON (US) LLP

(57) ABSTRACT

The present disclosure provides a packaging-level chip and a chip module packaged with a magnetic cover, and an electronic product. The packaging-level chip packaged with a magnetic cover comprises a die, a packaging material, a substrate and a magnetic cover. The packaging material is packaged on the outside of the die which is arranged on the substrate, and the magnetic cover is packaged on the top of the packaging material and is magnetic.

18 Claims, 3 Drawing Sheets

PACKAGING-LEVEL CHIP AND CHIP MODULE PACKAGED WITH MAGNETIC COVER, AND ELECTRONIC PRODUCT

CROSS-REFERENCE TO RELATED APPLICATION

This patent application claims priority, under 35 U.S.C. § 119, of Chinese Patent Application No. 202110193674.8, filed Feb. 20, 2021, which is incorporated by reference in its entirety.

TECHNICAL FIELD

The present disclosure relates to the field of semiconductor manufacturing, in particular to a packaging-level chip and a chip module packaged with a magnetic cover, and an electronic product.

BACKGROUND

With the change of PCIe Gen3/Gen4/Gen5 (the third generation/fourth generation/fifth generation high-speed serial computer extended bus port standard) as well as the emergence of UFS (Universal Flash Storage) or other high-speed compact products, the data transmission speed is getting faster, the data storage capacity is getting bigger, and the heat dissipation design for chips is becoming more challenging. The main heat dissipation methods of the existing products e.g. M.2 solid-state disk module) include: providing a metal cover, providing a surrounding sputtering heat dissipation coating, bare die packaging, exposed-die packaging, attached metal heat dissipation member and high thermal conductivity silicon pad, attached copper foil, attached graphite sheet.

The most commonly used heat dissipation method in the industry is attaching metal heat dissipation member and high thermal conductivity pad As shown in FIGS. 1 and 2, in the prior art, the packaging-level chip 1 comprises a die 2, a packaging material 3, and a substrate 4. The packaging-level chip 1 is arranged on a printed circuit board (PCB) 5, and cooperates with a thermal pad 6 (e.g. a high thermal conductive silicon pad) and a heat dissipation member 7 (e.g. a metal heat dissipation member) so as to constitute a chip module. The heat conduction path in the chip module makes the heat conducted from the packaging-level chip 1 to the silicon thermal pad 6 and to the heat dissipation member 7 and further to the environment air. It is understood that the arrows above the die 2 and outside of the packaging material 3 indicate the upward direction of heat conduction and heat convection.

The above heat dissipation design for the chip module has the advantage of outstanding heat dissipation performance and easy installation. The disadvantage is that the presence of the high thermal conductivity silicon pad and metal heat dissipation member significantly increases the overall height of the chip module, which limits the application range. The silicon thermal pad is prone to aging easily, which will deteriorate the heat dissipation effect. Air bubbles are apt to be present between the top of the packaging-level chip 1 (the top of package material 3) and the heat dissipation member 7, and thermal conductivity of air is low, which will impact the thermal resistance from the heat source (e.g. the die 2) in the packaging-level chip 1 to the heat dissipation member 7 and deteriorates the heat dissipation efficiency.

SUMMARY

The present disclosure provides a packaging-level chip and a chip module packaged with a magnetic cover, and an electronic product.

The packaging-level chip according to the present disclosure comprises: a die; a packaging material configured to be packaged on the outside of the die; a substrate on which the die is arranged; and a magnetic cover configured to be packaged on the top of the packaging material and magnetic.

In at least one embodiment, the magnetic cover includes a magnet which makes the top of the packaging-level chip magnetic.

In at least one embodiment, the magnet is arranged inside of the magnetic cover, and the magnet is spaced apart from the surface of the magnetic cover.

In at least one embodiment, the magnet is a neodymium magnet.

In at least one embodiment, the magnetic cover is a metal cover.

A chip module packaged with a magnetic cover according to the present disclosure includes: a packaging-level chip, which is the aforementioned packaging-level chip packaged with a magnetic cover; a printed circuit board on which the packaging-level chip is arranged; and a heat dissipation member, which is magnetically attracted on the magnetic cover.

In at least one embodiment, the chip module further comprises silicon thermal pad provided between the heat dissipation member and the magnetic cover.

In at least one embodiment, the heat dissipation member comprises at least one of a metal heat dissipation member, a heat pipe, a metal shell, a metal heatsink and a metal connector.

In at least one embodiment, a contact surface of the heat dissipation member and a contact surface of the magnetic cover cling to each other.

An electronic product provided by the present disclosure comprises the aforementioned chip module packaged with a magnetic cover.

The top of the packaging-level chip provided by the present disclosure can be fitted with a heat dissipation member. Through packaging the chip with the magnetic cover, the gap between the packaging-level chip and the heat dissipation member is small and the residual air is little, thereby the thermal resistance from the heat source to the heat dissipation member is reduced and it is beneficial to the heat dissipation. In addition, the heat dissipation member is positioned magnetically, such that the positioning and the attachment of the heat dissipation member are convenient, and the overall height of the chip module can be reduced without using a silicon thermal pad.

DETAILED DESCRIPTION OF EMBODIMENTS

Exemplary embodiments of the present disclosure are described below with reference to the drawings. It is understood that the detailed description is only used to teach those skilled in the art to implement the present disclosure, and it is neither intended to exhaust all possible implementation modes of the present disclosure, nor to restrict the scope of the present disclosure.

Figure 1:
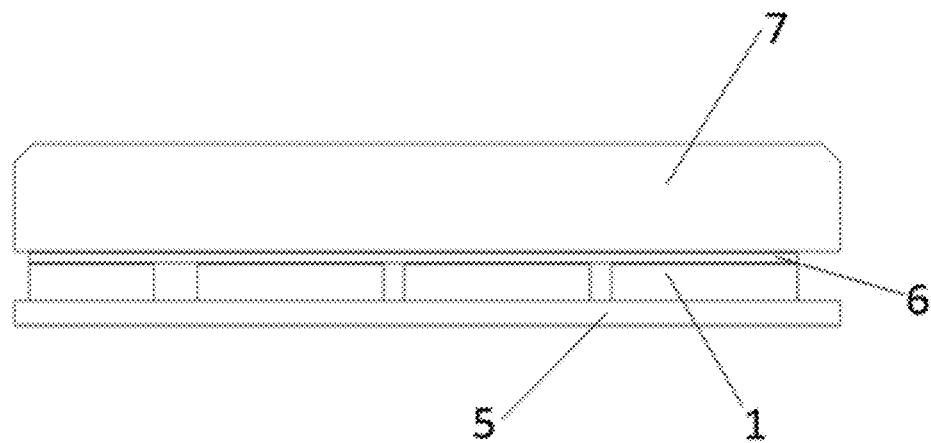
FIG. 1 is a schematic diagram showing the structure of a chip module in the prior art.
Figure 2:
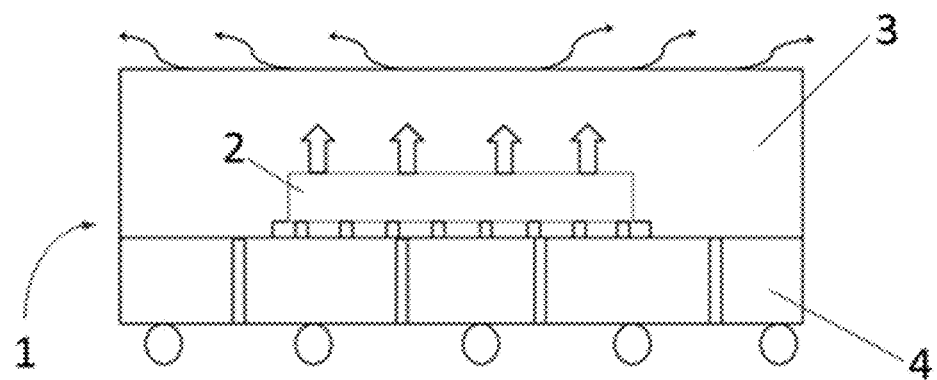
FIG. 2 is a schematic diagram showing the structure of a packaging-level chip in the prior art.
Figure 3:
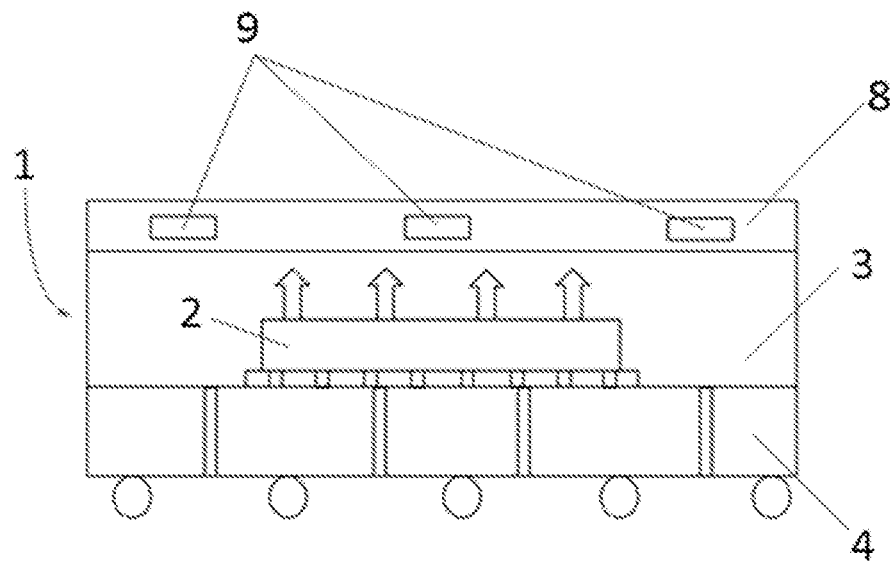
FIG. 3 is a schematic diagram showing the structure of a packaging-level chip according to an embodiment of the present disclosure.
Figure 4:
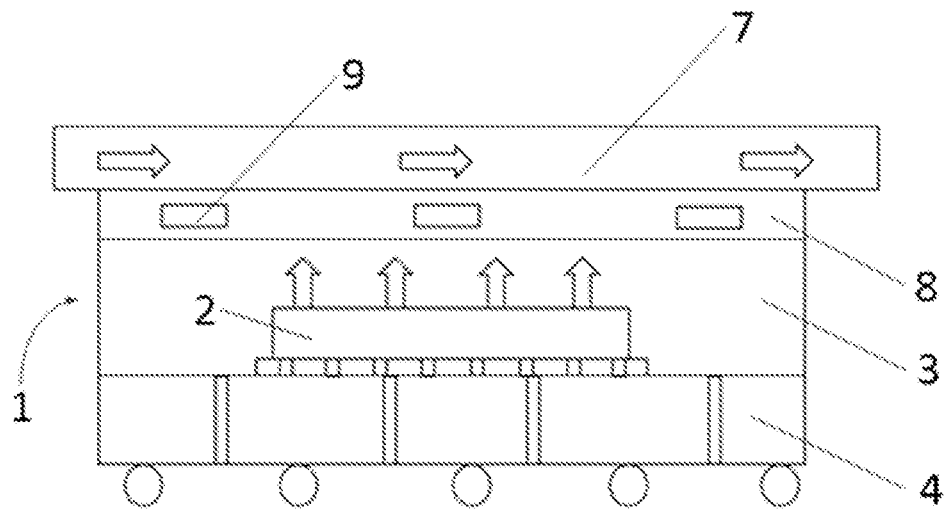
FIG. 4 is a schematic diagram showing the structure of a chip module according to an embodiment of the present disclosure.

The present disclosure provides a packaging-level chip packaged with a magnetic cover, a chip module packaged by a magnetic cover and an electronic product. As shown in FIGS. 3 and 4, the packaging-level chip 1 comprises a die 2, a packaging material 3, a substrate 4 and a magnetic cover 8

The packaging material 3 is packaged on the outside of the die 2 which is arranged on the substrate 4, and a magnetic cover 8 is packaged on the top of the packaging material 3. It is understood that compared with other fixing methods, the method of directly packaging the magnetic cover 8 on the top of the packaging material 3 is simpler in process, and the engagement of the magnetic cover 8 and the packaging material 3 is more reliable. There is no restriction on the specific usage posture of the packaging-level chip 1.

The magnetic cover 8 includes magnets 9 which is provided inside of the magnetic cover 8 and spaced by a certain distance from the surface of the magnetic cover 8. The magnetic cover 8 which is for example made of metal wraps the magnets 9 from outside, such that coupling between the magnetic field of the magnets 9 and the magnetic field of the packaging-level chip 1 can be suppressed. During the specific process, the magnetic cover 8 can be slotted, and block-shaped magnets 9 are arranged in the slots, and then the slots are sealed such that the magnets 9 are placed inside of the magnetic cover 8. If magnetic powder is added inside of the metal cover, the metal cover can be made magnetic and become the magnetic cover 8. However, the distribution of magnetic powder is not easy to control, which makes it not easy to suppress the magnetic field of the magnets 9. The magnetic powder may absorb electromagnetic waves during signal transmission and cause signal integrity problem. The magnets 9 may be neodymium magnets, although the specific type of the magnets 9 is not limited in the present disclosure. The magnetic cover 8 may include a magnet, although the specific number of the magnet 9 is not limited in the present disclosure.

The magnetic cover 8 can be a metal cover, which can better conduct heat to the heat dissipation member 7 (described later) by utilizing the better thermal conductivity of the metal.

Figure 5:
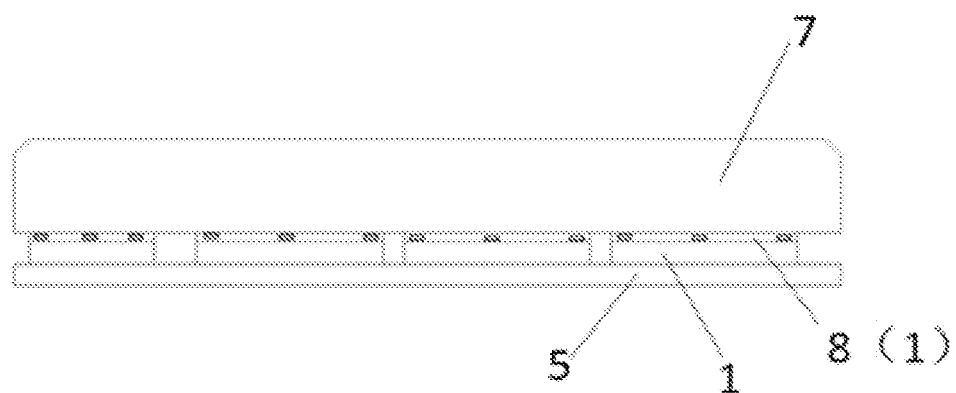
FIG. 5 is a schematic diagram showing the structure of another chip module according to an embodiment of the present disclosure.

As shown in FIGS. 4 and 5, the chip module comprises a packaging-level chip 1, a printed circuit board 5, and a heat dissipation member 7.

The packaging-level chip 1 is the aforementioned packaging-level chip 1, which is arranged on the printed circuit board 5, and the heat dissipation member 7 is attracted on the magnetic cover 8. For example, four packaging-level chips 1 can be arranged on the printed circuit board 5 to form a chip module so as to implement specific functions. It is understood that the specific usage posture of the chip module is not limited, and the number of the packaging-level chips 1 required by each chip module is not limited.

The material of the heat dissipation member 7 may have ferromagnetism, such that the heat dissipation member 7 and the magnetic cover 8 can cling to each other by magnetic force and gravity. The contact surface between the heat dissipation member 7 and the magnetic cover 8 may be uneven at micro scale and air may be trapped therein. An attraction force exerted by the magnetic force can reduce the air between the packaging-level chip 1 and the heat dissipation member 7 to a certain extent, reduce the thermal resistance and improve the heat dissipation efficiency. Silicone grease can also be applied between the heat dissipation member 7 and the magnetic cover 8. The magnetic force makes the silicone grease distributed on the uneven surfaces of the heat dissipation member 7 and the magnetic cover 8 better, so as to squeeze the air better. It is understood that the thinner silicone grease has little influence on the height of the chip module.

In addition, the magnetic force exerted by the packaging-level chip 1 on the heat dissipation member 7 can guide the heat dissipation member 7 to the attachment position, which is more conducive to the positioning and the attachment of the heat dissipation member 7.

The heat dissipation member 7 can be one of a metal heat dissipation member, a heat pipe, a metal shell, a metal heatsink and a metal connector. It is understood that the arrows inside of the heat dissipation member 7 in FIG. 4 indicate the heat dissipation direction, but the direction is not limited to rightward.

An electronic product according to the present disclosure comprises the aforementioned chip module, and the packaging-level chip 1 in the chip module is packaged with the magnetic cover 8. Chip modules with different functions are assembled together to form a terminal electronic product. The electronic product can be a hard disk, a mobile phone, an electronic computer, etc.

In the present disclosure, heat dissipation coatings such as silicon thermal pad and the like may not be used, such that the height of the chip module is reduced to a certain extent, and the problem of failure of polymer materials such as silicon thermal pad and the like is avoided.

The above are the preferred embodiments of the present disclosure. It should be pointed out that for those skilled in the art, without departing from the principle of the present disclosure, improvements and modifications can be made, which should also be regarded as being included in the protection scope of the present disclosure.

What is claimed is:
1. A packaging-level chip comprising:
   a die;
   a packaging material configured to be packaged on outside of the die;
   a substrate on which the die is arranged; and
   a magnetic cover including a block-shaped magnet, wherein the magnet is arranged inside the magnetic cover and the magnet is spaced apart from a surface of the magnetic cover, the magnetic cover is configured to be packaged on top of the packaging material, the magnetic cover is configured to suppress coupling between a magnetic field of the magnet and a magnetic field of another component of the packaging-level chip, and a magnetic force exerted by the magnetic cover is configured to guide a heat dissipation member to an attachment position with respect to the magnetic cover.
2. The packaging-level chip according to claim 1, wherein the magnetic cover is packaged directly on top of the packaging material.

3. The packaging-level chip according to claim 1, wherein the magnet is a neodymium magnet.

4. The packaging-level chip according to claim 1, wherein the magnetic cover includes a plurality of magnets.

5. The packaging-level chip according to claim 1, wherein the magnetic cover is a metal cover.

6. A chip module comprising:
a packaging-level chip comprising:
a die;
a packaging material configured to be packaged on outside of the die;
a substrate on which the die is arranged; and
a magnetic cover including a block-shaped magnet, wherein the magnet is arranged inside the magnetic cover and the magnet is spaced apart from a surface of the magnetic cover, the magnetic cover is configured to be packaged on top of the packaging material and the magnetic cover is configured to suppress coupling between a magnetic field of the magnet and a magnetic field of another component of the packaging-level chip;
a printed circuit board on which the packaging-level chip is arranged; and
a heat dissipation member which is magnetically attracted to the magnetic cover, wherein a magnetic force exerted by the packaging-level chip is configured to guide the heat dissipation member to an attachment position with respect to the magnetic cover.

7. The chip module according to claim 6, further comprising silicone grease disposed between the heat dissipation member and the magnetic cover.

8. The chip module according to claim 6, wherein the heat dissipation member comprises at least one of a metal heat dissipation member, a heat pipe, a metal shell, a metal heatsink, or a metal connector.

9. The chip module according to claim 6, wherein a contact surface of the heat dissipation member and a contact surface of the magnetic cover cling to each other.

10. The chip module according to claim 6, wherein the magnetic cover includes a magnet and the magnetic cover is packaged directly on top of the packaging material.

11. The chip module according to claim 6, wherein the magnet is a neodymium magnet.

12. The chip module according to claim 6, wherein the magnetic cover includes a plurality of magnets.

13. The chip module according to claim 6, wherein the magnetic cover is a metal cover.

14. An electronic product, comprising:
a chip module, the chip module comprising:
a packaging-level chip comprising
a die,
a packaging material configured to be packaged on outside of the die;
a substrate on which the die is arranged, and
a magnetic cover including a block-shaped magnet, wherein the magnet is arranged inside the magnetic cover and the magnet is spaced apart from a surface of the magnetic cover, the magnetic cover is configured to be packaged on top of the packaging material and the magnetic cover is configured to suppress coupling between a magnetic field of the magnet and a magnetic field of another component of the packaging-level chip;
a printed circuit board on which the packaging-level chip is arranged; and
a heat dissipation member which is magnetically attracted to the magnetic cover, wherein a magnetic force exerted by the packaging-level chip is configured to guide the heat dissipation member to an attachment position with respect to the magnetic cover.

15. The electronic product according to claim 14, wherein the chip module further comprises silicone grease disposed between the heat dissipation member and the magnetic cover.

16. The electronic product according to claim 14, wherein the heat dissipation member comprises at least one of a metal heat dissipation member, a heat pipe, a metal shell, a metal heatsink, or a metal connector.

17. The electronic product according to claim 14, wherein a contact surface of the heat dissipation member and a contact surface of the magnetic cover cling to each other.

18. The electronic product according to claim 14, wherein the magnetic cover is packaged directly on top of the packaging material.

\* \* \* \* \*